(12) United States Patent
Lee et al.

(10) Patent No.: US 7,413,959 B2
(45) Date of Patent: Aug. 19, 2008

(54) SEMICONDUCTOR DEVICE INCLUDING A PLANARIZED SURFACE AND METHOD THEREOF

(75) Inventors: Jae-Dong Lee, Suwon (KR); Yong-Pil Han, Ann Arbor, MI (US); Chang-Ki Hong, Seoul (KR)

(73) Assignee: Samsung Electronics Co., L.T.D., Gyeonggi-Do (KR)

( * ) Notice: Subject to any disclaimer, the term of this patent is extended or adjusted under 35 U.S.C. 154(b) by 308 days.

(21) Appl. No.: 10/419,076

(22) Filed: Apr. 21, 2003

(65) Prior Publication Data

US 2004/0029375 A1 Feb. 12, 2004

(30) Foreign Application Priority Data

Aug. 7, 2002 (KR) .................. 10-2002-0046575

(51) Int. Cl.
*H01L 21/00* (2006.01)
(52) U.S. Cl. .................. 438/407; 438/424; 438/689
(58) Field of Classification Search .................. 438/424, 438/433, 437, 421, 427, 435, 439, 296, 687, 438/633, 407, 689; 257/697, 510, 516
See application file for complete search history.

(56) References Cited

U.S. PATENT DOCUMENTS

| 6,069,057 | A | * | 5/2000 | Wu | 438/424 |
| 6,245,635 | B1 | * | 6/2001 | Lee | 438/407 |
| 6,268,265 | B1 | * | 7/2001 | Hwang et al. | 438/424 |
| 6,461,225 | B1 | * | 10/2002 | Misra et al. | 451/41 |
| 6,887,137 | B2 | * | 5/2005 | Lee et al. | 451/57 |
| 6,946,397 | B2 | * | 9/2005 | Hong et al. | 438/689 |
| 2002/0087537 | A1 | * | 7/2002 | Evans | 707/6 |
| 2002/0151177 | A1 | * | 10/2002 | Cherian et al. | 438/691 |
| 2003/0166381 | A1 | * | 9/2003 | Lee et al. | 451/41 |
| 2004/0029375 | A1 | * | 2/2004 | Lee et al. | 438/626 |
| 2005/0106872 | A1 | * | 5/2005 | Hong et al. | 438/689 |

FOREIGN PATENT DOCUMENTS

| JP | 1134947 | 5/1999 |
| KR | 2002-87537 | 11/2002 |

* cited by examiner

*Primary Examiner*—Laura M Schillinger
(74) *Attorney, Agent, or Firm*—Harness, Dickey & Pierce, P.L.C.

(57) ABSTRACT

A method of planarizing the surface of a semiconductor substrate to reduce the occurrence of a dishing phenomenon. A patterned etch stop layer defining a trench region is formed on a substrate. The substrate is etched to form a trench region, and a medium material layer and an oxide layer are subsequently formed on the substrate, filling the trench region. Chemical mechanical polishing (CMP) is performed on the oxide layer until the medium material layer is exposed. CMP is then performed until the patterned etch stop layer is exposed and a planarized oxide layer is formed. Because the medium material layer has a higher removal rate during CMP than the oxide layer, occurrences of the dishing phenomenon are reduced. A slurry including an anionic surfactant is used to increase the CMP removal ratio of the medium material layer to the oxide layer.

13 Claims, 3 Drawing Sheets

SEMICONDUCTOR DEVICE INCLUDING A PLANARIZED SURFACE AND METHOD THEREOF

CROSS-REFERENCE TO RELATED APPLICATIONS

This U.S. non-provisional application claims priority under 35 U.S.C. §119 to Korean Patent Application No. 2002-46575, filed Aug. 7, 2002 in the Korean Intellectual Property Office, the contents of which are incorporated herein by reference in its entirety.

BACKGROUND OF THE INVENTION

1. Field of the Invention

The present invention relates generally to the field of semiconductor devices, and more particularly, to a method of planarizing the surface of a semiconductor device and reduce the occurrence of the dishing phenomenon and a semiconductor device manufactured according to the method. The present invention also relates to a method of increasing the removal rate ratio of a medium material layer to an oxide layer during chemical mechanical polishing (CMP).

2. Description of the Related Art

As the density and size of semiconductor devices decrease and the interconnection structure of semiconductor devices are multiplied, the height of the steps on the surfaces of the semiconductor devices have increased. In order to planarize the surface steps, a spin-on glass (SOG) process, an etch back process, or a chemical mechanical polishing (CMP) process is typically used.

When CMP is used as a wide area planarizing technique, a wafer surface is pressed against a polishing pad while an abrasive slurry flows to a contact area of the wafer and the polishing pad. The wafer surface chemically reacts with the slurry, while the polishing pad and the wafer, which rotate relative to each other, physically planarize irregularities on the wafer surface.

FIGS. 1 and 2 are cross-sectional views illustrating a conventional method of separating an active region, where operations of a semiconductor device occur, from a field region, which is an inactive region, by filling a trench with an oxide layer in a shallow trench isolation (STI) process and planarizing the surface of the oxide layer using CMP.

Referring to FIG. 1, an etch stop layer 12 for CMP (e.g., a silicon nitride layer) is formed on a silicon substrate 10. A photolithography process using a photoresist layer (not shown) is then performed so that an etch stop layer pattern is formed which defines a region where trenches will be located. Next, the silicon substrate 10 is etched using the etch stop layer pattern as an etch mask so that a trench region 14 having a desired depth is formed. A silicon oxide layer 16 is blanket-deposited on the silicon substrate 10 and the trench region 14. As a result, the trench region 14 is filled with an oxide layer having an excellent gap-fill characteristic.

Optionally, a pad oxide layer (not shown) may be formed on the substrate 10 before the etch stop layer 12 (e.g., silicon nitride layer) is formed. In another example, a thermal oxide layer (not shown) or a liner layer (not shown) may be formed on the bottom and the sidewalls of the trench region 14 before the silicon oxide layer 16 is deposited in the trench region 14.

Referring to FIG. 2, CMP is performed on the silicon oxide layer 16 to expose the etch stop layer 12. Thereafter, the etch stop layer 12 is removed so that a field region for isolating devices is formed. In the field region, the trench region 14 in the silicon substrate 10 is filled with a silicon oxide layer 16a.

A plurality of trench regions 14 having various widths can be formed in the silicon substrate 10 depending upon the circuit design. When the width of the trench region 14 is large, a large amount of the silicon oxide layer 16 remains after CMP. As a result, CMP is excessively performed to remove the remaining silicon oxide layer 16. Thus, a large amount of the silicon oxide layer 16 in the trench region 14 (which has a relatively small width) is removed, which results in a dishing phenomenon (e.g., the silicon oxide layer 16 has a concave shape), as is shown in FIG. 2. Because the dishing phenomenon deteriorates the surface planarity of the silicon substrate and causes defects in the semiconductor device, it is desirable to reduce the occurrence of the dishing phenomenon.

SUMMARY OF THE INVENTION

At least one exemplary embodiment of the present invention provides a method of planarizing the surface of a semiconductor device to reduce the occurrence of a dishing phenomenon. A patterned etch stop layer, such as a patterned silicon nitride layer, which defines a trench region, is formed on a base material layer (e.g., a substrate). The substrate is etched to form a trench region, and a medium material layer and a buried material layer (e.g., an oxide layer) are subsequently formed on the substrate to fill the trench region. The medium material layer can be formed over the entire surface of the substrate, e.g., on the patterned etch stop layer and in the trench region, or it can be formed on the patterned etch stop layer and not in the trench region. Alternatively, the medium material layer can be selectively removed from the trench layer. Any material that has a higher removal rate during chemical mechanical polishing (CMP) is suitable for use as the medium material layer. A boron phosphorous silicate glass (BPSG) may be used as the medium material layer and a PE-TEOS oxide layer, a USG oxide layer, or an HDP oxide layer may be used as the oxide layer.

Once the medium material layer and the oxide layer are formed on the substrate and the trench region is filled, a first CMP process is performed on the oxide layer until the medium material layer is exposed. A second CMP process is then performed until the patterned etch stop layer is exposed and a highly planarized oxide layer is formed. Because the medium material layer has a higher removal rate in the CMP processes than the oxide layer, occurrences of the dishing phenomenon can be reduced.

In addition, a slurry that includes an anionic surfactant can be used to increase the CMP removal ratio of the medium material layer to the oxide layer. Exemplary embodiments use a ceria-based abrasive that includes ammonium polycarboxylate (APC) as an additive. The APC can be added to the slurry in an amount of approximately 2.0 to 4.5 parts by weight. The adsorption of APC onto the oxide layer decreases the removal rate of the oxide layer. Further, the polishing rate ratio of the medium material layer (e.g., BPSG layer) to the oxide layer may be at least 10:1 during CMP.

Additionally, at least one exemplary embodiment of the present invention provides a semiconductor device that includes a base material layer, such as a silicon substrate, that includes a depression region (e.g., a trench region), a medium material layer formed on the bottom of the depression region, and a buried material layer positioned on the medium material layer. The medium material layer and the buried material layer fill the depression region. In addition, the buried material layer has a planarized surface.

The base material layer may be an insulating material layer or a conductive material layer formed on a silicon substrate.

Any material that has a higher polishing removal rate than the buried oxide layer can be used. In at least one exemplary embodiment, the etch stop layer is a silicon nitride layer, and the buried material layer is an oxide layer, such as, for example, a PE-TEOS layer, an HDP oxide layer, or a USG layer. The medium material layer may be a BPSG layer.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF EXEMPLARY EMBODIMENTS

Figure 1:
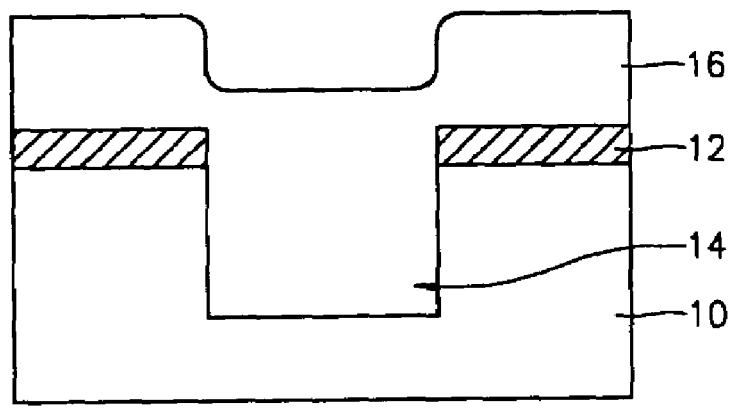
FIGS. 1 and 2 are cross-sectional views illustrating a conventional method for planarizing the surface of a semiconductor device.
Figure 2:
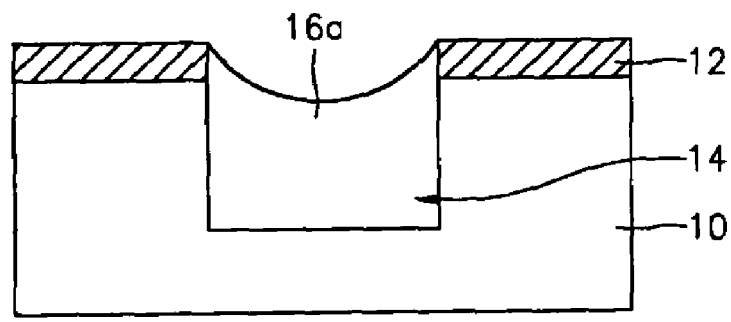

Exemplary embodiments of the present invention will now be described more fully with reference to the accompanying drawings, in which exemplary embodiments of the invention are shown. This invention may, however, be embodied in many different forms and should not be construed as being limited to the exemplary embodiments set forth herein. Rather, these exemplary embodiments are provided so that this disclosure can be thorough and complete and will fully convey the concept of the present invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same elements. Similarly, throughout the specification, like numbers refer to like elements.

FIGS. 3 through 6 are cross-sectional views illustrating a method according to at least one exemplary embodiment of the present invention for separating a semiconductor device into an active region, where operations of the semiconductor device occur, and a field region, which is an inactive region, by filling trenches with an oxide layer in a shallow trench isolation (STI) process and planarizing the surface of the semiconductor device using a planarizing process (e.g., a chemical mechanical polishing (CMP) process).

Figure 3:
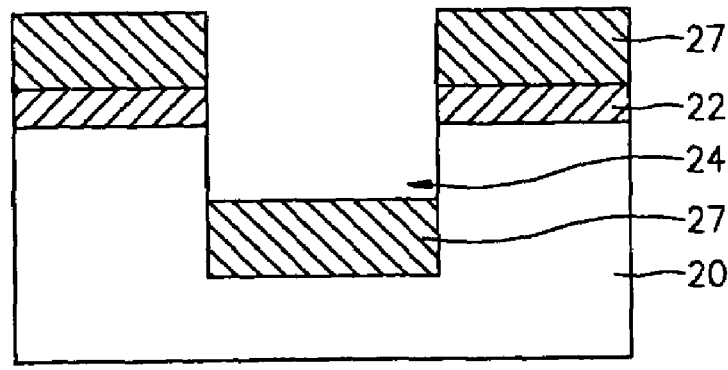
FIGS. 3 through 6 are cross-sectional views illustrating a method for planarizing the surface of a semiconductor according to an exemplary embodiment of the present invention.

Referring to FIG. 3, an etch stop layer (not shown), for example, a silicon nitride layer, for CMP is formed on a base material layer (e.g., a silicon substrate 20) as a target layer for a surface planarizing process. Thereafter, a photolithography process using a photoresist layer (not shown) is performed so that a silicon nitride layer pattern 22 defining a trench region 24 is formed. Optionally, a pad oxide layer (not shown) may be deposited on the silicon substrate 20 before the etch stop layer (e.g., silicon nitride layer) is deposited in order to form a dual-layered etch stop layer that includes the silicon nitride layer and the pad oxide layer.

The silicon substrate 20 is etched using the silicon nitride layer pattern 22 as an etch mask to form a trench region 24 having a desired depth. A medium material layer (e.g., a boron phosphorus silicate glass (BPSG) layer 27), is then blanket-deposited over the silicon substrate 20 and the trench region 24. Alternatively, the BPSG layer 27 can be formed on the silicon nitride layer and not in the trench region 24 or the BPSG layer 27 can be selectively removed from the trench region 24 so that the BPSG layer is formed on the silicon nitride layer and not in the trench region 24.

The BPSG layer 27 may be used as the medium material layer because the BPSG layer 27 is weak due to the presence of boron and phosphorus. As a result, the BPSG layer 27 has a higher removal rate during CMP than a buried material layer (e.g., an oxide layer) which, as described below, fills the trench region 24 in a subsequent process. Although BPSG is specifically disclosed herein as an example of the medium material, any material having a higher removal rate during CMP than the buried material layer can be used as the medium material layer. When a difference between the polishing removal rate of the buried material layer and the polishing removal rate of the medium material layer exists, occurrences of the dishing phenomenon can be reduced.

Figure 4:
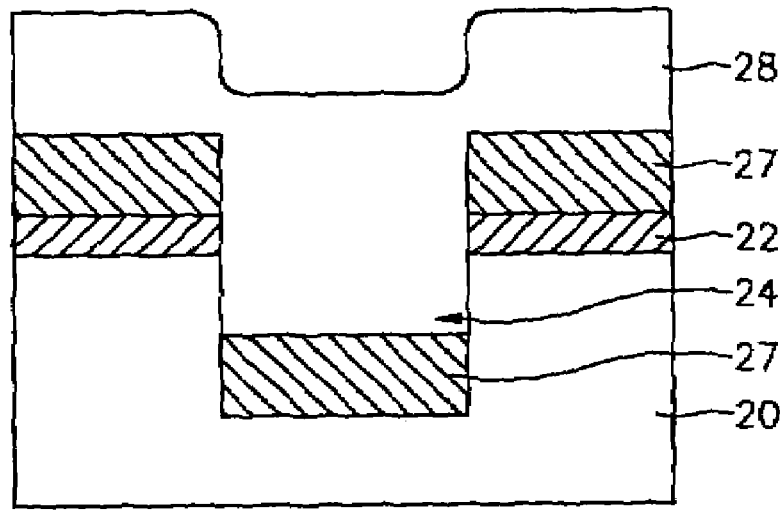

Referring to FIG. 4, a buried oxide layer 28 is blanket-deposited on the BPSG layer 27 to fill the trench region 24. As a result, the trench region 24 is filled with an oxide layer having excellent gap-fill characteristics. Suitable examples of the oxide layer include, but are not limited to, a PE-TEOS oxide layer, a USG oxide layer, and an HDP oxide layer. Optionally, a thermal oxide layer (not shown) or a silicon liner layer (not shown) can be formed on the bottom and the sidewalls of the trench region 24 before the buried oxide layer 28 is deposited in the trench region 24.

Figure 5:
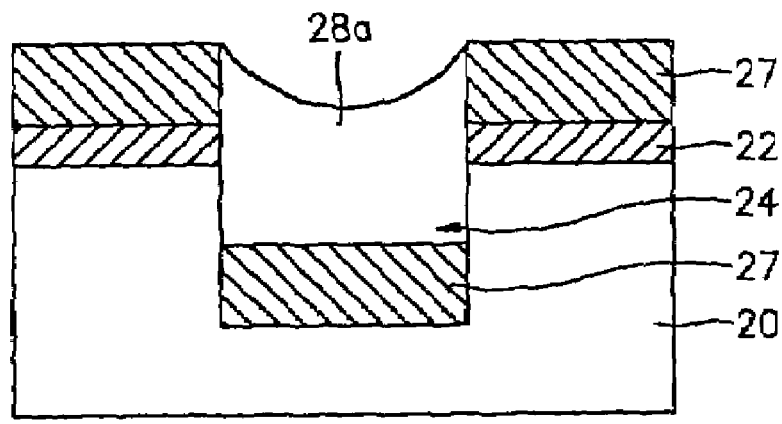

Referring to FIG. 5, a first CMP is performed on the buried oxide layer 28 on the surface of the silicon substrate 20 until the surface of the BPSG layer 27 is exposed. A concave buried oxide layer 28a may be formed in the trench region 24 depending upon the width of the trench region 24.

Figure 6:
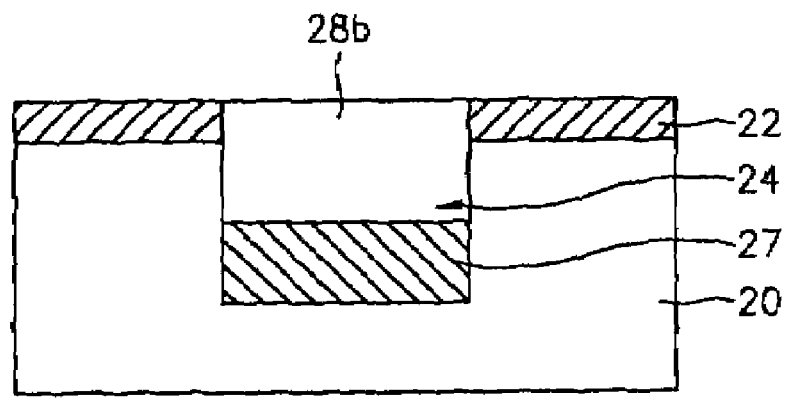

Referring to FIG. 6, a second CMP is performed until the surface of the silicon nitride layer 22 is exposed. This second CMP forms a highly planarized buried oxide layer 28b, which reduces the occurrence of the dishing phenomenon. Optionally, the silicon nitride layer 22 can be removed to form a trench device isolation region.

As discussed above, during CMP, a wafer surface is pressed against a polishing pad while an abrasive slurry flows to a contact area of the wafer and the polishing pad. In exemplary embodiments of the present invention, a slurry is used to increase the difference between the polishing removal rate of the buried oxide layer 28 and the polishing removal rate of the BPSG layer 27. In general, the CMP removal rate of the BPSG layer is higher than that of the oxide layer, which, as described above, may be a PE-TEOS oxide layer, a USG oxide layer, or an HDP oxide layer. The CMP removal rates of the layers change depending on the reflow condition of the BPSG layer 27, the densities of boron and phosphorous in the BPSG layer 27, and the type of slurry used.

An experiment was performed to determine how the CMP removal rate and the removal rate ratio, e.g., selectivity, of a PE-TEOS oxide layer and a BPSG layer change according to the type of slurry used. In the experiment conducted, an AMAT Mirra polisher was used, and IC 1000 and Suba4 were used as a top pad and a sub pad of a platen pad, respectively. Slurry-A is a silica-based slurry and slurry-B1 and slurry-B2 are ceria-based slurries. The results of the experiment are shown in Table 1.

TABLE 1

| Slurry | PE-TEOS removal rate | BPSG removal rate | Removal rate ratio |
|---|---|---|---|
| slurry-A | 2,226 Å/min | 6,122 Å/min | 2.7 |
| slurry-B1 | 2,260 Å/min | 5,200 Å/min | 2.3 |
| slurry-B2 | 4,985 Å/min | 8,346 Å/min | 1.7 |

Referring to Table 1, although the molecular structure of the BPSG layer and the molecular structure of the oxide layer are similar, the molecular structure of the BPSG layer is weak due to the inclusion of boron and phosphorus. As a result, the CMP removal rate of the BPSG layer is typically higher than the CMP removal rate of the oxide layer. For example, the removal rate ratio of the BPSG layer to the oxide layer can be one to three.

A second experiment was performed to determine if the CMP removal rate ratio of the BPSG layer to the oxide layer could be increased. In the second experiment, an AMAT Mirra polisher was used, and IC1000 and Suba4 were used as the top pad and the sub pad of the platen pad, respectively. The slurry was a silica-based slurry that included an abrasive in an amount of 1 part by weight. The amount of additive added to the slurry was varied and the removal rate was measured. The additive added to the slurry was an anionic surfactant, such as ammonium polycarboxylate (APC)

It was determined that the difference between the polishing removal rate of the BPSG layer and the polishing removal rate of the PE-TEOS layer increases depending on the amount of APC added to the slurry. The results of the experiment are illustrated in Table 2 and in FIG. 7.

TABLE 2

| APC density | PE-TEOS removal rate | BPSG removal rate | Removal rate ratio (selectivity) |
|---|---|---|---|
| 0 wt % | 5,552 Å/min | 7,596 Å/min | 1.4 |
| 0.8 wt % | 4,985 Å/min | 8,346 Å/min | 1.7 |
| 2.0 wt % | 949 Å/min | 8,304 Å/min | 8.8 |
| 2.8 wt % | 168 Å/min | 7,241 Å/min | 43.2 |
| 4.0 wt % | 135 Å/min | 2,633 Å/min | 19.5 |

Figure 7:
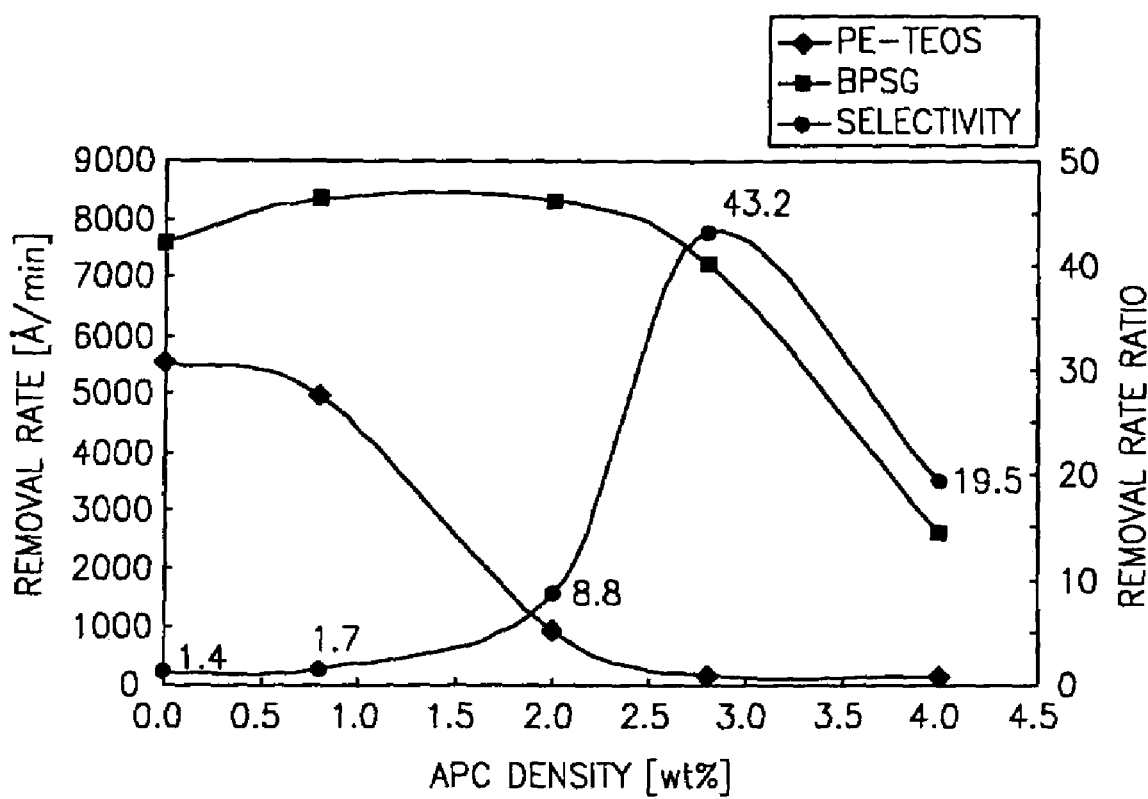
FIG. 7 is a graph illustrating the removal rate and the removal rate ratio of a medium material layer and a buried material layer according to the density of an additive added to a slurry when performing a method for planarizing the surface of a semiconductor according to at least one exemplary embodiment of the present invention.

As shown in Table 2 and FIG. 7, the density of APC adsorbed onto the surface of the oxide layer increases with an increase in the density of APC in the slurry. Thus, adsorbed APC represses the removal of the oxide layer during CMP and decreases the removal rate. PE-TEOS and BPSG layers perform similar to that of APC; however, the adsorbed amount of APC and the removal rate of the PE-TEOS layer are different from the adsorbed amount of APC and the removal rate of the BPSG layer at a given density of APC. In particular, since the BPSG layer is weaker than the oxide layer due to the inclusion of boron and phosphorus in the BPSG layer and since the adsorbed amount of APC in the BPSG layer is less than the adsorbed amount of APC in the oxide layer, the BPSG layer may have a higher density of APC than the oxide layer. As a result, the removal rate ratio, e.g., the selectivity of the BPSG layer to the PE-TEOS layer can exceed 40:1 at a specific APC density.

In exemplary embodiments of the present invention, the removal rate ratio of the medium material layer to the buried material layer may be over 5:1 and may be over 10:1 to reduce the occurrence of the dishing phenomenon in trench regions that have a wide width. The density of APC in the slurry may be in the range of about 2.0 to 4.5 parts by weight.

Although at least one exemplary embodiment of the present invention describes the trench region 24 formed in the silicon substrate 20 as being filled and the surface of the trench region 24 as being planarized, exemplary embodiments of the present invention can be applied to the surface planarizing process for removing steps on various other materials, such as, for example, an insulating layer and/or a conductive layer, deposited on the silicon substrate 20.

In addition, although specific material layers such as the buried oxide layer 28 and the medium material layer 27 have been described above, various materials which have a difference in their removal rates during CMP can be used, and would be easily identified by one of ordinary skill in the art. Further, various types of slurries for CMP can be used to increase the difference between the removal rates, e.g., the removal rates of the oxide layer and the BPSG layer.

According to exemplary embodiments of the present invention, a medium material layer that has a higher removal rate during CMP than the removal rate of the buried oxide layer and a CMP slurry which increases the removal rate ratio between the BPSG layer and the oxide layer are used. As a result, occurrences of the dishing phenomenon in the depression region is reduced in the surface planarizing process, (e.g., CMP, etch back, or spin-on glass), even when the width of the depression region (e.g., trench region) is large.

Although exemplary embodiments of this invention have been described in detail hereinabove, it should be understood by those of ordinary skill in the art that various changes in form and details may be made therein and will still fall within the spirit and scope of the present invention as defined in the appended claims.

What is claimed is:

1. A method of planarizing the surface of a semiconductor device, the method comprising;
    etching a base material layer having an etch stop layer pattern to form a depression region on the base material layer;
    forming a medium material layer on at least the etch stop layer pattern;
    depositing a buried material layer on the medium material layer to fill the depression region, the medium and buried material layers including different compositions;
    removing the buried material layer until the surface of the medium material layer is exposed; and
    planarizing the medium material layer and the buried material layer until the surface of the etch stop layer pattern is exposed; wherein the buried material layer has a lower removal rate during planarizing than a removal rate of the medium material layer during planarizing.

2. The method of claim 1, wherein during forming, the medium material layer is formed in the depression region and on the etch stop layer pattern.

3. The method of claim 1, wherein the base material layer is a silicon substrate, and the depression region is a trench region penetrating the base material layer.

4. The method of claim 1, wherein the base material layer is formed on a silicon substrate, the base material layer being selected from an insulating material layer and a conductive material layer, and wherein the depression region is a trench region penetrating the base material layer.

5. The method of claim 1, wherein the etch stop layer is a silicon nitride layer, and the buried material layer is an oxide layer.

6. The method of claim 5, wherein the oxide layer is selected from the group consisting of a PE-TEOS layer, an HDP oxide layer and a USG layer, and the medium material layer is a BPSG layer.

7. The method of claim 6, wherein during planarizing, the medium material layer and the buried material layer are planarized by a chemical mechanical polishing.

8. The method of claim 7, wherein a polishing rate ratio of the BPSG layer to the oxide layer is at least 10:1 for the chemical mechanical polishing.

9. The method of claim 8, wherein a slurry used during the chemical mechanical polishing includes ammonium polycarboxylate (APC) as an additive.

10. The method of claim 9, wherein the slurry used during the chemical mechanical polishing is a ceria-based abrasive slurry.

11. The method of claim 10, wherein APC is added to the slurry in an amount of from approximately 2.0 to 4.5 parts by weight.

12. The method of claim 1, further comprising forming at least one of a thermal oxide layer and a silicon liner layer in the depression region before the depositing step.

13. The method of claim 1, wherein the etch stop layer is a silicon nitride layer, and the buried material layer is an oxide layer;
   planarizing the medium material layer and the buried material layer by a chemical mechanical polishing;
   forming a polishing rate ratio of a BPSG layer for the medium material layer to the oxide layer to at least 10:1 for the chemical mechanical polishing;
   forming a slurry used during the chemical mechanical polishing that includes ammonium polycarboxylate (APC) as an additive; wherein the slurry used during the chemical mechanical polishing is a ceria-based abrasive slurry;
   adding the APC to the slurry in an amount of from approximately 2.0 to 4.5 parts by weight.

* * * * *